United States Patent
Kudelka et al.

(10) Patent No.: US 6,740,595 B2
(45) Date of Patent: May 25, 2004

(54) ETCH PROCESS FOR RECESSING POLYSILICON IN TRENCH STRUCTURES

(75) Inventors: Stephan Kudelka, Dresden (DE); Helmut Tews, Unterhaching (DE); Alexander Michaelis, Wolfshagen (DE); Uwe Schroeder, Dresden (DE); Martin Popp, Dresden (DE); Kristin Schupke, Dresden (DE); Daniel Koehler, Dresden (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/122,996

(22) Filed: Apr. 12, 2002

(65) Prior Publication Data

US 2003/0194867 A1 Oct. 16, 2003

(51) Int. Cl.$^7$ .............................................. H01L 21/311
(52) U.S. Cl. .................... 438/704; 438/696; 438/745
(58) Field of Search ................. 438/696, 303, 438/595, 694, 695, 704, 706, 14, 17, 305, 239, 396, 745, 753, 754, 34, 43, 301

(56) References Cited

U.S. PATENT DOCUMENTS

| | | | | |
|---|---|---|---|---|
| 4,948,757 A | * | 8/1990 | Jain et al. ...................... | 438/52 |
| 5,147,499 A | * | 9/1992 | Szwejkowski et al. ...... | 438/704 |
| 6,348,289 B1 | * | 2/2002 | Couteau et al. ............... | 430/30 |
| 6,458,711 B1 | * | 10/2002 | O'Brien et al. ............. | 438/745 |
| 6,492,275 B2 | * | 12/2002 | Riley et al. ................. | 438/696 |

OTHER PUBLICATIONS

VLSI Technology, pp. 119–121 (S.M. Sze editor, 2d edition, 1988).

DRAM Technology For Today's Market And Future DRAM Generations, Neumueller et al., submitted to the 27th European Solid–State Device Research Conference, Stuttgart, Sep. 22–24, 1997. Retrieved from the Internet: <www.essderc.org/papers–97/315.pdf>.

Edwin C. Kan, Introduction to Microelectromechanical Systems, noted for Jan. 31, Feb. 5 and Feb. 7, 2002 (popular MEMS fabrication processes), pp. 33–44. Retrieved from the Internet: <http://courses.ece.cornell.edu/ece432/handouts/Feb. 5, 2002.pdf>.

* cited by examiner

*Primary Examiner*—Carl Whitehead, Jr.
*Assistant Examiner*—Laura M Schillinger
(74) *Attorney, Agent, or Firm*—Lerner, David, Littenberg, Krumholz & Mentlik, LLP

(57) ABSTRACT

A method for eching a recess in a polysilicon region of a semiconductor device by applying a solution of $NH_4OH$ in water to the polysilicon.

8 Claims, 8 Drawing Sheets

FIG. 10A
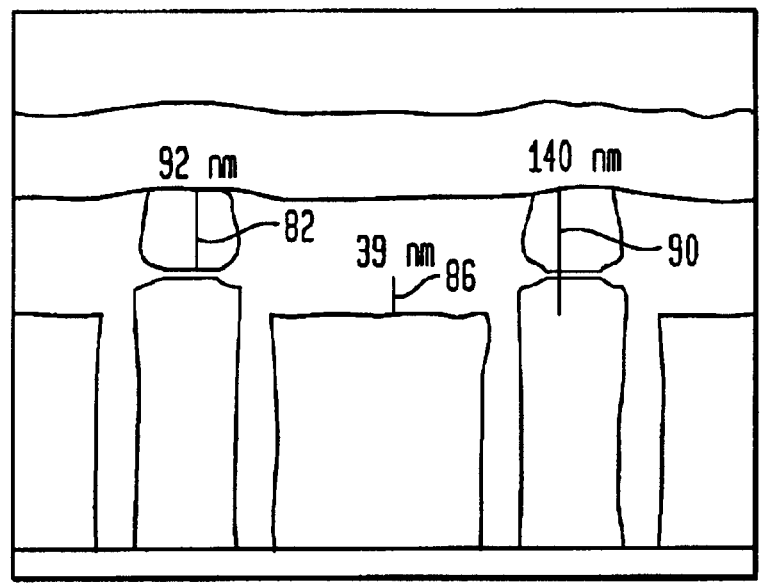
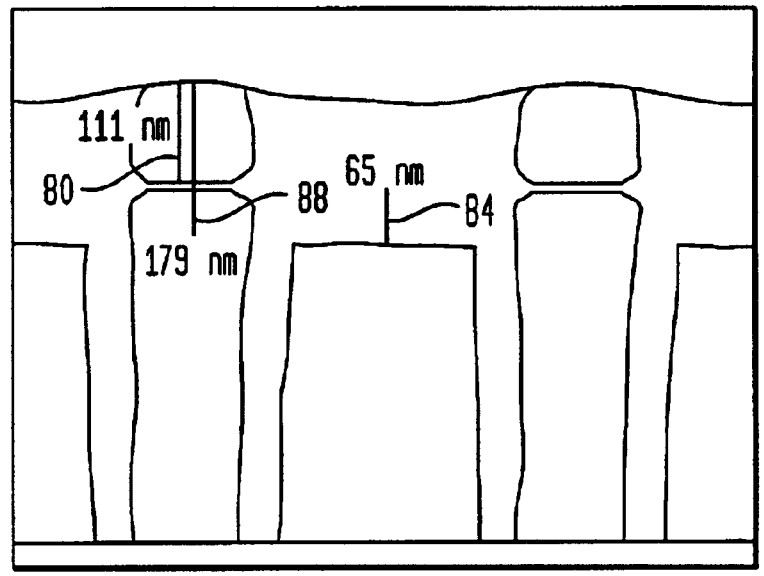

ETCH PROCESS FOR RECESSING POLYSILICON IN TRENCH STRUCTURES

BACKGROUND OF THE INVENTION

Fabricating semiconductor devices is a complex process. It involves many steps that require extreme precision and highly pure materials. A semiconductor wafer is provided at an early step in the fabrication process. The wafer serves as a base substrate. Layers of material are added onto the substrate. The shape and composition of the added layers and the substrate are modified to fabricate device components.

A variety of semiconductor devices can be made with a few basic components, such as transistors and capacitors. One widely used device is dynamic random access memory (DRAM). The basic DRAM device is a memory cell having one capacitor and one transistor. The capacitor stores a charge representing data. The transistor allows the data to be written to or read from the capacitor. By reducing the size of its components, semiconductor manufacturers can fit more DRAM devices onto a chip. The increase in the amount of DRAM devices results in greater memory capacity for the chip.

One method of minimizing the size of devices is to vertically construct the components (i.e., where a semiconductor device includes components such as capacitors formed at several or more layers thereof). One way to accomplish such vertical construction may involve forming a trench in a semiconductor substrate. In the process of forming a capacitor, polysilicon ("poly-Si") may be deposited in the trench as a conducting material or as a sacrificial fill that will be removed during later process steps. The poly-Si may be recessed by removing a portion of the poly-Si through an etching process. Layers of conductive or insulating material may then be deposited in the recessed area of the poly-Si.

The steps of etching the polysilicon and depositing a new composition can be repeated until the desired component is formed. Fabricating components in this manner requires precise control over the process.

Various etching procedures are used to recess poly-Si. One procedure employs reactive ion etching (RIE). RIE is a form of dry etching that may recess poly-Si by bombarding it with charged particles. This type of etching is anisotropic, meaning that when recessing poly-Si in a trench, RIE will etch more in one direction than another direction.

One drawback to RIE is that it is very sensitive to errors in the fabrication process. For instance, the recess depth in a trench depends upon the size of the opening of the trench. With RIE in general, the wider the trench opening, the shallower the recess depth for a given etch time. If the masks used to create multiple trenches vary in size due to normal process fluctuations, using RIE can result in different poly-Si recess depths for different devices on the same substrate. This amounts to even less control over the etching process.

Another drawback to RIE is that only a few wafers can be etched at one time. This results in a low yield that drives up the cost of producing semiconductor devices. Therefore, there is a need for a high yield alternative etch process that gives the manufacturer better supervision over the etching process and greater control overall.

Yet another drawback to RIE is that it is not a very selective process. Selectivity is the ratio of the etch rate of one material as compared to the etch rate of another material. For example, in an etching step to remove poly-Si from a trench having an oxide collar, poor selectivity could mean that nearly as much oxide is removed as poly-Si. If too much of the oxide collar is removed, the component formed in the trench may be unusable. Therefore, poor selectivity takes away some of the manufacturer's control over the etching process. RIE has a selectivity of about 50:1 when comparing the etch rates of poly-Si and silicon dioxide ("$SiO_2$"). This means that RIE is fifty times more effective at etching poly-Si than it is at etching $SiO_2$. Similarly, RIE has a selectivity of about 10:1 when comparing its etch rates for poly-Si and silicon nitride ("SiN").

The present invention solves the problems associated with RIE by replacing RIE with a highly efficient wet chemical etching process. The present process uses a solution of ammonium hydroxide ("$NH_4OH$") in water to etch poly-Si. The solution of $NH_4OH$ and water is isotropic, meaning that it etches equally in all directions, yet it has a very high selectivity between poly-Si and other materials. For example, $NH_4OH$ has a typical selectivity of about 9,000:1 when comparing the etch rates of poly-Si to $SiO_2$. $NH_4OH$ has a typical selectivity of about 50,000:1 when comparing the etch rates of poly-Si to SiN.

The etch rate can be controlled by altering the concentration, temperature and/or exposure time of the solution. Unlike RIE, the present wet chemical etching process is more cost efficient than RIE because many wafers can be etched simultaneously using relatively inexpensive chemicals. Furthermore, the present invention is relatively unaffected by trench dimension errors (e.g., where the trench dimensions are larger or smaller than specified). This is because the present wet chemical etching process generates new etch chemicals (e.g., hydroxyl ions) even in the bottom of the trench. These new etch chemicals prevent chemical depletion and allow the poly-Si to be etched to a desired depth.

In the past, solutions containing $NH_4OH$, water and other chemicals such as hydrogen peroxide have been used to remove surface contaminants while cleaning semiconductor devices during the fabrication process. However, a solution of $NH_4OH$ and water has not previously been used to recess poly-Si. That is because cleaning solutions may contain oxidizing chemicals such as $H_2O_2$. These oxidizing chemicals may passivate the surface of the poly-Si with $SiO_2$ films, thereby inhibiting the etching process.

SUMMARY OF THE INVENTION

In accordance with one example of the present invention, a method is provided for fabricating a semiconductor device on a semiconductor substrate. As used herein, the term "substrate" is intended to include semiconductor wafers made of silicon, other elements or compound semiconductors (e.g., substrates formed from a combination of materials). It is also intended to include semiconductor wafers that have been processed in some manner so that additional materials may have been deposited or formed thereon. Furthermore, the term "poly-Si" as used herein is intended to include all forms of silicon including, but not limited to crystalline silicon, epitaxial silicon and amorphous silicon. The poly-Si may include a dopant (e.g., arsenic, phosphorous or boron), and other materials may be associated with it (e.g., germanium may be added to the poly-Si to form silicon-germanium).

The semiconductor device fabricated in accordance with the present method may comprise a poly-Si region having a first dimension. In one embodiment, the method comprises first applying a solution comprising $NH_4OH$ in water to the poly-Si region. The solution is used to etch the poly-Si to obtain a second dimension of a desired shape and size.

The etch rate of the method may be adjusted by varying one or more parameters of the solution. For example, one parameter that may be adjusted is the concentration of the solution. In a preferred embodiment, the concentration of $NH_4OH$ to water may vary from a ratio of 1:2 to 1:200 ($NH_4OH:H_2O$). In another preferred embodiment, the concentration may be between 1:5 and 1:80. In yet another preferred embodiment, the concentration may be between 1:5 and 1:50. The foregoing concentration ranges are approximate, and the concentration may be slightly higher than the upper limit or slightly lower than the lower limit of such ranges.

The etch rate of the present method may also be adjusted by varying the temperature of the solution. The temperature may range between 25° C. and 65° C. This temperature range is also approximate. Thus, in preferred embodiments, the temperature may be slightly more than 25° C. or slightly less than 65° C.

In another preferred embodiment, the temperature may be between 25° C. and 45° C. In yet another preferred embodiment, the concentration of the solution may be between 1:5 and 1:80 while the temperature may be between 25° C. and 45° C. In yet another preferred embodiment, the temperature is held substantially constant by employing a convolution bath. In yet another preferred embodiment, the solution is degasified. The manufacturer maintains excellent control over the etching process by choosing the temperature, concentration and application time sufficient for a desired etch rate.

In accordance with another example of the present invention, a method is provided for fabricating a semiconductor device. Initially, a trench is formed in a semiconductor substrate. The trench may have lower and upper regions. Next, poly-Si may then be deposited in the trench. In a preferred embodiment, the poly-Si may substantially fill the lower and upper regions of the trench. However, it should be appreciated that the amount of poly-Si deposited in the trench may vary in accordance with the desired structure and operation of the semiconductor device being fabricated. The poly-Si is preferably doped, either with n or p type dopant. The extent of doping can vary widely in accordance with design choices. A first solution comprising $NH_4OH$ in water is then applied to the poly-Si. The first solution is used to etch a portion of the poly-Si to recess the poly-Si to a desired shape and size.

In a preferred embodiment, the method of fabricating a semiconductor device may include several steps in addition to those described above. For example, a collar oxide may be formed in the upper region of the trench before the poly-Si is deposited. SiN may then be deposited in the upper region of the trench after the portion of poly-Si is etched with the first solution of $NH_4OH$ in water. Next, a portion of SiN may be etched from a bottom of the upper region. Then, a second solution of $NH_4OH$ in water may be applied to the poly-Si. The second solution may have the same or different concentration and temperature as the first solution. The second solution is used to etch a second portion of the poly-Si in the lower region of the trench. This results in the trench having a bottle shape, with the lower region being wider than the upper region.

The method of fabricating a semiconductor device may also include the additional procedure of performing RIE after the SiN is deposited. Etching by a RIE process removes at least a portion of the SiN in the bottom of the upper region. It may also remove another portion of the poly-Si that is in the lower region of the trench. RIE may be used to remove a seam, if any exists, in the lower region of the trench.

In accordance with another example, the first and second solutions of $NH_4OH$ in water may have a concentration between 1:5 and 1:80. Additionally, the first and second solutions preferably have a temperature between 25° C. and 65° C. As stated previously, these ranges are approximate and may be slightly more or less than these maximums and minimums. Also, in this example the first and second solutions are preferably degasified.

In accordance with another example of the present invention, a method is provided for fabricating a semiconductor device having multiple components on a substrate. Initially, at least one layer of material is added onto the substrate. The material preferably comprises a doped (either n or p type) semiconductor. However, in alternative embodiments, the material may comprise conductors or insulating compositions. Then, a solution of $NH_4OH$ in water is applied to the at least one layer. The solution is used to etch the material to obtain a desired shape and size.

Other steps may be employed in embodiments of the method for fabricating the semiconductor devices. The steps of adding additional layers, applying the solution, and etching may be repeated until the desired semiconductor device is fabricated. Preferably at least one of the layers of material comprises poly-Si. The solution may be refreshed to maintain a desired etch rate.

The method of the present invention may be used to fabricate a variety of semiconductor devices. The foregoing aspects, features and advantages of the present invention will be further appreciated when considered with reference to the following description of the preferred embodiments and accompanying drawings.

BRIEF DESCRIPTION OF THE DRAWINGS

FIG. 10A is a schematic illustration comparing actual etch depth variances between RIE and the etching process of the present invention.

DETAILED DESCRIPTION

In accordance with a preferred embodiment of the present invention, a solution comprising $NH_4OH$ in water is applied to poly-Si in a trench. The solution is used to etch the poly-Si in the trench so that the poly-Si is recessed to a desired depth. The etch rate can be varied by altering solution concentration, temperature, and exposure time.

The trenches containing the poly-Si can be of various dimensions, depending upon their application. For example, a DRAM capacitor has a main trench that will be filled with a material to form a capacitor therein, which will store the charge of the memory cell. The main trench is typically 6000 nm deep with a top width of less than 200 nm. Other trenches having different dimensions may be formed during fabrication of the DRAM memory cell.

A wide range of concentrations and temperatures are available for the solution of $NH_4OH$ in water. In one example, the concentration is between 1:5 and 1:80 ($NH_4OH:H_2O$). The temperature range in this example is between 25° C. and 65° C.

Gas concentration also has an effect on the $NH_4OH$ solution in water. Hydrogen gas is formed during etching. Bubbles of the gas can inhibit etching and leave portions of the poly-Si unetched. One way to avoid this problem is to employ a degasified $NH_4OH$ solution in water in a flow-through reaction chamber. The solubility of gases in the etch solution may be increased by prior degasification, so that the amount of gas that can be dissolved is increased and the formation of bubbles is suppressed. A degasifier brings the water in contact with a membrane that has a vacuum on the other side, so that dissolved gases may diffuse out of the water into the vacuum. In a flow-through reaction chamber, the wafers are exposed to the chemicals in a closed system so that the water is not gasified from ambient air (as in an open tank). In addition, the water may be replaced one or more times during the etching process, so that ungasified water is applied again thereto.

By etching with a solution of $NH_4OH$ in water instead of RIE, thinner oxide and nitride liner layers adjacent to the trench can be used when fabricating semiconductor devices. That is because the selectivity of the solution is significantly higher than the selectivity of RIE. Thinner material layers are preferred because the dimensions of the trench itself may be very small (e.g., as small as 900 Å). Thin layers of, for instance, an oxide layer formed by local oxidation of silicon (LOCOS) or tetraethylorthosilicate (TEOS) may be between 200 Å and 500 Å.

Figure 1:
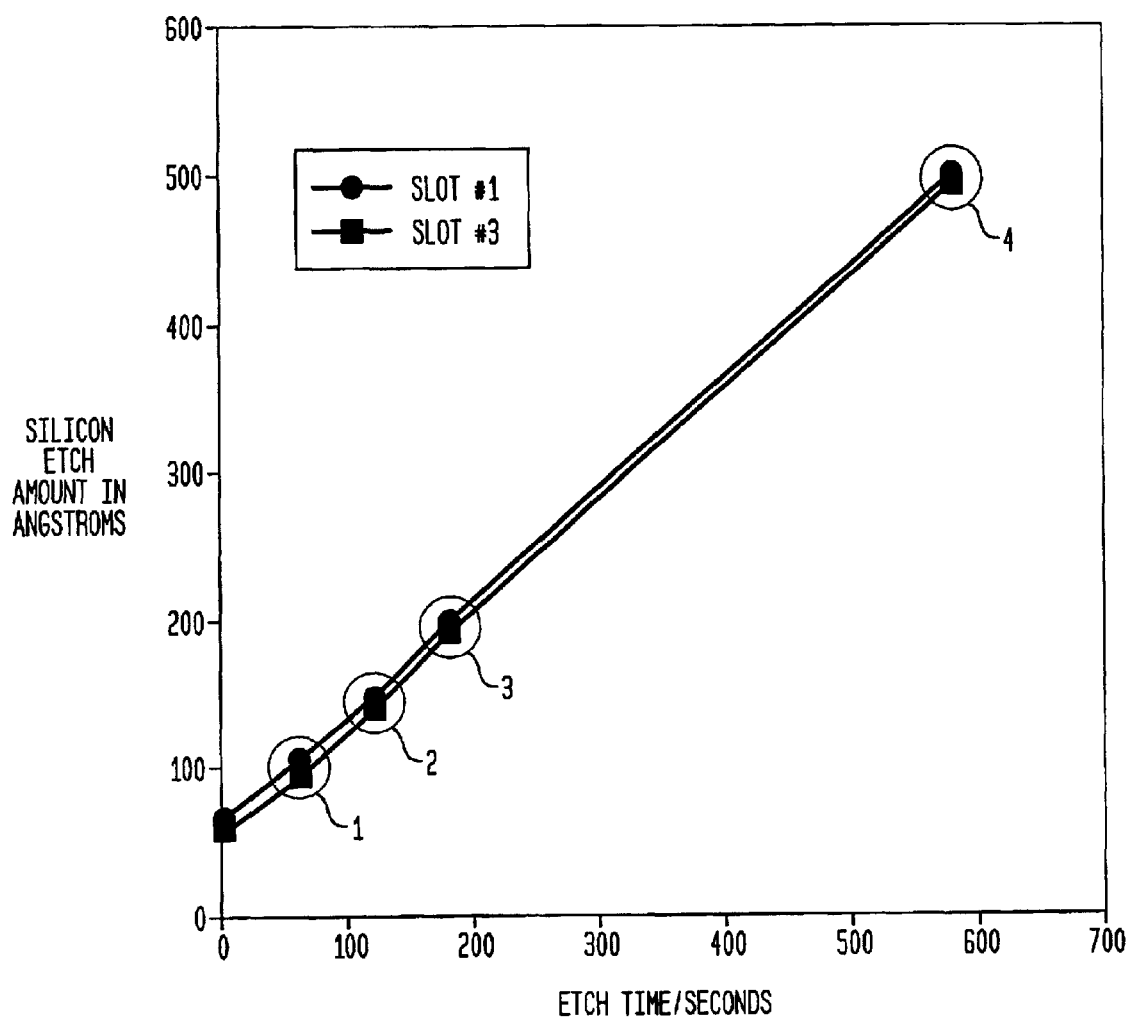
FIG. 1 graphically illustrates the poly-Si etch rate whereby a quantity of poly-Si is removed in accordance with examples of the present invention.

In an example of the present invention, the concentration of $NH_4OH$ to water ($NH_4OH:H_2O$) is about 1:80. The temperature of the concentration is about 45° C. This example has a selectivity of about 5,000:1 for poly-Si relative to oxides and selectivity above about 100,000:1 for poly-Si relative to nitrides. FIG. 1 presents the etch rate of poly-Si for the first example.

In FIG. 1, the vertical axis represents the amount of poly-Si etched in angstroms. The horizontal axis represents the etch time in seconds. Slot #1 represents a wafer next to the chamber wall of the reaction vessel. Slot #3 represents a wafer in the center of the reaction vessel. Data point 1 indicates that a poly-Si layer was etched to a depth of about 100 Å in about 70 seconds. Data point 2 illustrates that an etch depth of about 150 Å was obtained through the use of the present wet etch process in about 120 seconds. Similarly, data point 3 illustrates that an etch depth of about 200 Å was obtained in about 180 seconds. Likewise, data point 4 illustrates that a trench of about 500 Å was etched in the poly-Si layer in about 590 seconds. As FIG. 1 shows, the etch rate may decrease as time progresses. This may be due to a cooling of the chamber. Periodically refreshing (e.g., replacing) the $NH_4OH$ solution may help prevent the decrease in the etch rate.

FIGS. 2–7 schematically illustrate the progress in fabricating a semiconductor device through use of the present wet etch process. In particular, FIGS. 2–7 illustrate how to create a DRAM trench capacitor 10 having a collar and a bottle. The collar is an oxide that provides isolation for the capacitor by preventing the formation of vertical parasitic transistors between the capacitor and other regions of the DRAM device.

The bottle is a widened bottom portion of the trench. The enlarged size of the bottle allows the capacitor to store more charge than a trench capacitor without the bottle shape. This is important because when a capacitor is reduced in size to fit more components on a substrate, the smaller size reduces the charge the capacitor can hold. If the available charge is too low, the DRAM memory cell may not function properly.

Figure 2:
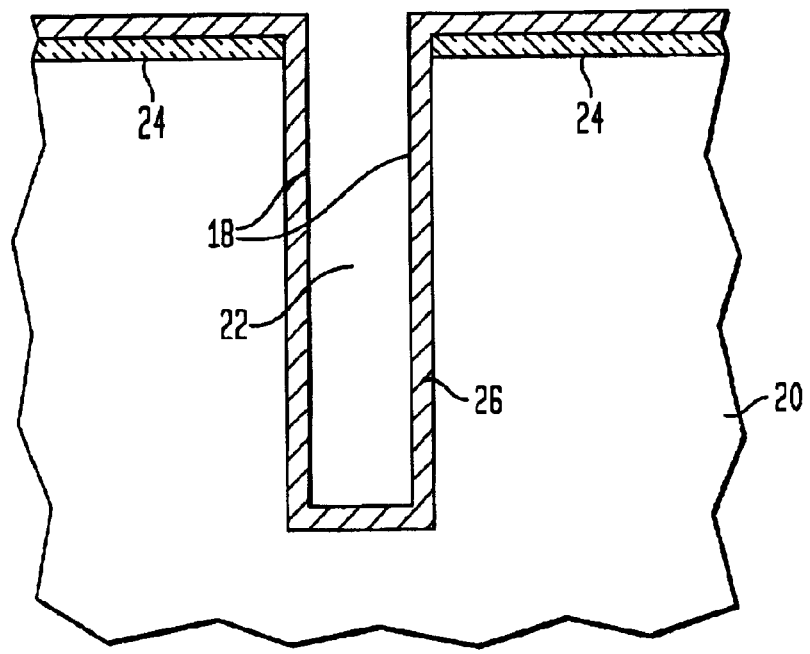
FIG. 2 illustrates the result of one step in the present method of fabricating a semiconductor device.

FIG. 2 is a schematic cross-sectional illustration of a portion of trench capacitor 10. In particular, FIG. 2 illustrates a trench 22, including sidewalls 18, formed in a silicon substrate 20. Nitride pads 24 are arranged on either side of the upper part of the trench 22. The nitride pads 24 may be formed by depositing a silicon nitride liner. The nitride pads 24 act as a barrier against later etching and doping steps.

The trench 22 may be etched into the silicon substrate 20. This may be accomplished through any one of various known etching procedures. For example, the process of etching the trench 22 may employ a positive or a negative photolithographic process. By way of example, general steps of a positive photolithographic etching process are described below. It should be appreciated that a negative process, or other etching process, may be used. A mask (not shown) is applied to a portion of the substrate 20 to shield it from UV light while permitting UV light to contact the portion of the substrate 20 where the trench 22 is to be formed. Next, a photo resist may be applied to the surface of substrate 20, followed by exposure to a UV light source through the mask to the portion of the surface of the substrate 20 that corresponds to the trench 22. Then, the portion of the resist exposed to the UV light may be removed by a solvent, resulting in an exposed area that will become the surface of the trench 22. RIE or some other etching process as is known in the art may then be used to remove a further portion of substrate 20, resulting in the trench 22 having a desired shape and size.

Oxide 26 lines the trench 22 and overlays the nitride pads 24. The oxide liner 26 may be formed by chemical vapor deposition (CVD) or other known oxide formation techniques. One of several types of CVD may be employed. One preferable type is plasma-enhanced CVD (PECVD). Another preferable type is low pressure CVD (LPCVD). Either PECVD or LPCVD may be used with TEOS to form oxide liner 26.

Figure 3:
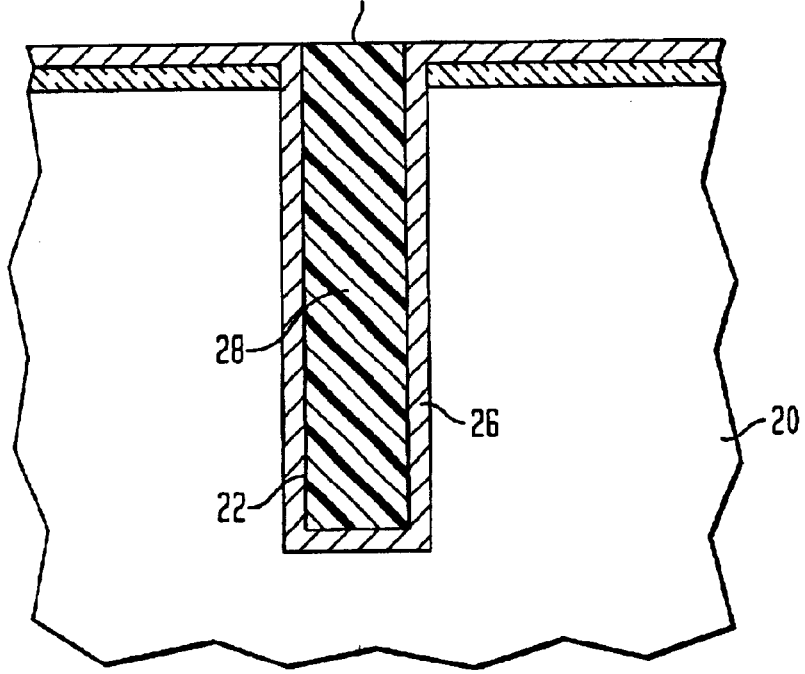
FIG. 3 illustrates the result of a further step in the present method of fabricating a semiconductor device.

FIG. 3 illustrates the trench 22 filled with poly-Si 28. Poly-Si 28 may be deposited within the trench 22. The poly-Si 28 has a surface 29 that may be at the top of the trench at this point in the fabrication process.

Prior to performing a first etching step, the surface 29 of poly-Si 28 may be smoothed. Smoothing may improve recess uniformity in later processing steps, such as etching. For example, the smoothing may be performed by means of chemical mechanical polishing (CMP). In CMP, a slurry of an abrasive material suspended in a liquid is applied to a surface to minimize irregularities. CMP is an optional step that occurs prior to recessing with the solution of NH$_4$OH in water. It should be understood that various alternate smoothing procedures could be employed instead of CMP.

Figure 4:
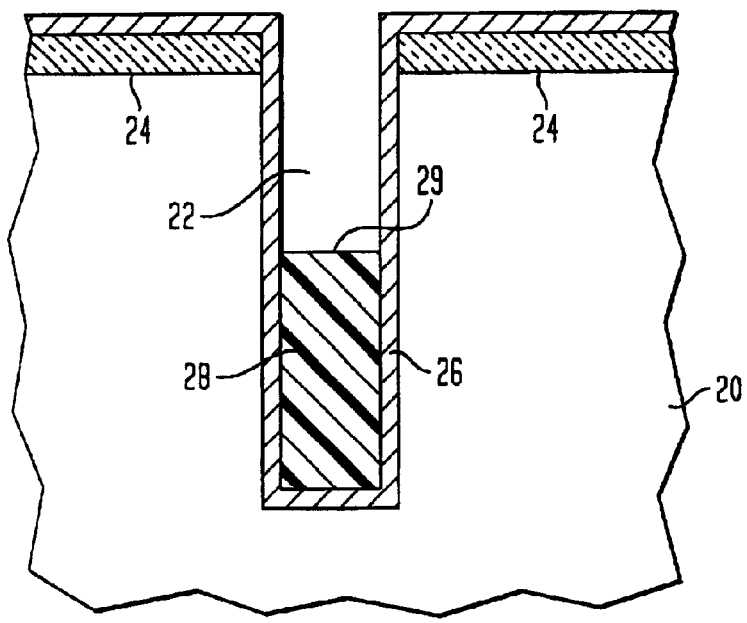
FIG. 4 illustrates the result of yet a further step in the present method of fabricating a semiconductor device.

FIG. 4 illustrates a portion of the trench capacitor 10 after the poly-Si 28 has been partially removed. Surface 29 is below the top of the trench 22 at this point in the fabrication process. Poly-Si 28 has been etched by applying a first solution of NH$_4$OH in water thereto. The poly-Si 28 may be exposed to the solution for a period of time sufficient to etch poly-Si 28 to a desired depth. In an example, a solution of NH$_4$OH having a concentration of 1:60 (NH$_4$OH:H$_2$O) applied to the poly-Si 28 at a temperature of 45° C. for 600 seconds would remove approximately 1000 nm of the poly-Si. It should be understood that the exposure time may vary depending upon the temperature and concentration of the solution.

Figure 5:
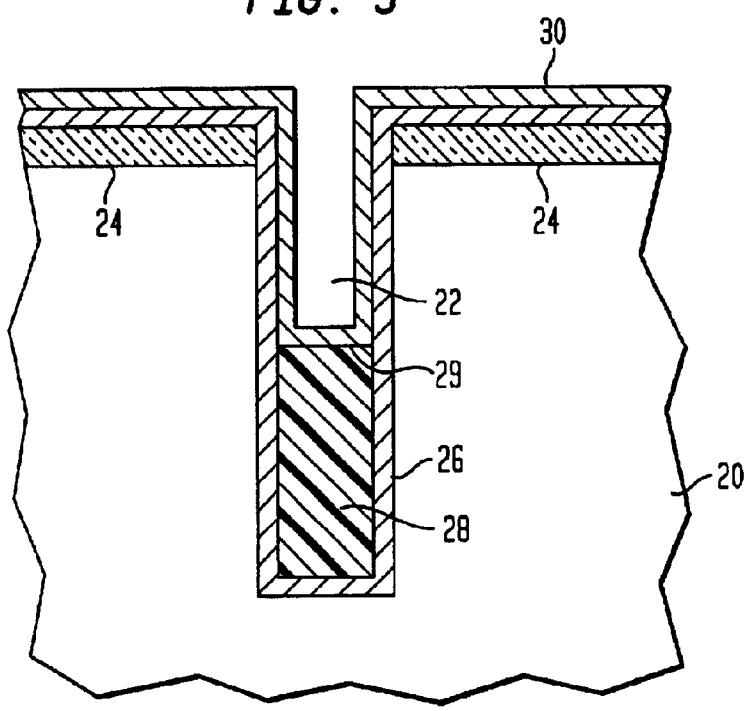
FIG. 5 illustrates the result of yet a further step in the present method of fabricating a semiconductor device.

FIG. 5 illustrates the trench 22 after a layer of SiN 30 is deposited therein. SiN 30 may deposited with CVD or other known procedures. For example, the SiN 30 may be deposited by using LPCVD. SiN 30 may be deposited in preparation of forming a bottle shape of the trench capacitor 10.

Figure 6:
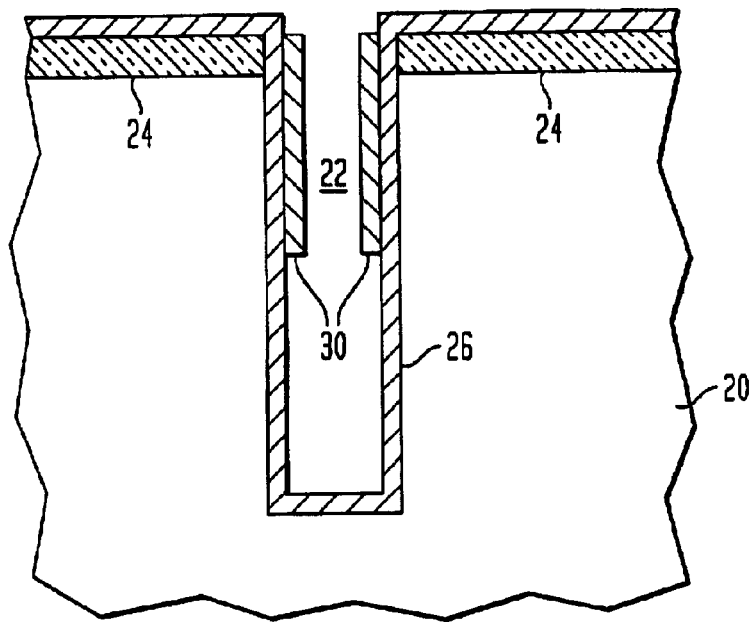
FIG. 6 illustrates the result of yet a further step in the present method of fabricating a semiconductor device.

FIG. 6 illustrates a portion of the trench capacitor 10 at another step in the fabrication process after removing a portion of the SiN 30 from the trench 22. At least a portion of poly-Si 28 may be removed. The trench 22 may have a slightly narrowed top due to-a portion of the SiN 30 that may remain on oxide liner 26. For instance, this may occur after another etching step with RIE or other known procedures. RIE or another etching process may be used to remove a portion of SiN 30 that was on top of surface 29 of the poly-Si 28. RIE may also remove a portion of any remaining poly-Si 28. This process step may be used to eliminate a seam or void that may have existed in the poly-Si 28.

Another etching step using a solution of NH$_4$OH in water may then be performed. Note that this solution may have a different temperature, concentration and exposure time than the first etching solution. The solution may remove any of the poly-Si 28 remaining in the trench 22. After this etching step, the trench 22 may have a bottle shape, wherein a bottom region of the trench 22 is wider than a top region of the trench 22.

Figure 7:
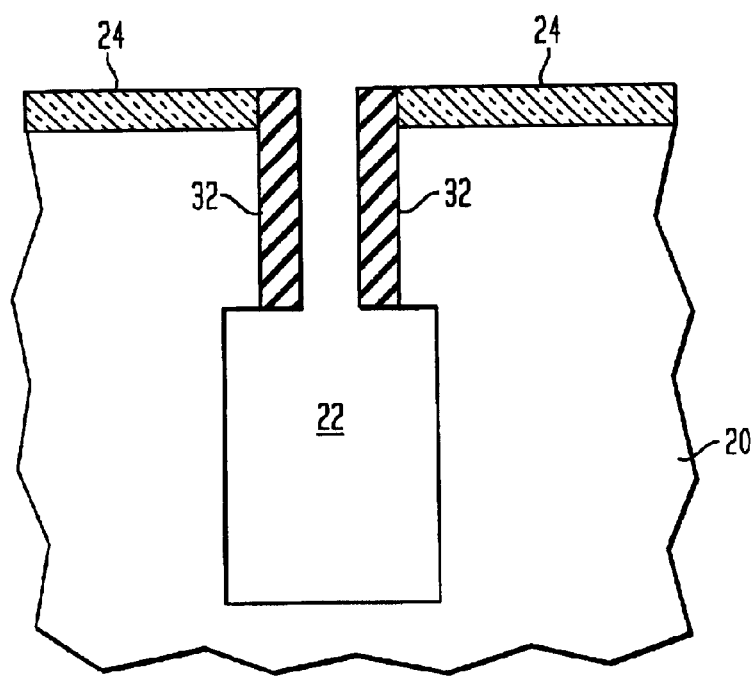
FIG. 7 illustrates the result of yet a further step in the present method of fabricating a semiconductor device.

FIG. 7 is a schematic cross sectional illustration of a bottle-shaped trench 22. The remaining oxide liner may now be an oxide collar 32 in the top region of the trench 22. After the bottle shape has been etched and any excess poly-Si 28, excess oxide liner 26, and SiN 30 have preferably been removed, a dielectric buried plate (not shown) may be formed along the bottom region of the trench. Next, the bottle-shaped trench 22 may be filled with a capacitive material (not shown). The remaining portions of trench capacitor 10 may then be formed. Then, connections to the rest of the semiconductor device may be fabricated (not shown).

In another example of the invention, the concentration of the solution of NH$_4$OH in water may be between about 1:5 and 1:50 (NH$_4$OH:H$_2$O). The temperature of the solution may be between about 25° C. and 65° C. The etch rate can be varied from less than about 1 nm/minute to about 250 nm/minute by adjusting the concentration and/or temperature. Note that other concentrations, temperatures and exposure times can be used depending upon the trench depth desired. In this example, the selectivity between silicon oxide and silicon nitride is about 1:50. This selectivity allows the formation of a trench, for example, of a buried strap contact between a capacitor and a transistor of a DRAM memory cell, wherein the trench size and shape are within acceptable manufacturing tolerances.

Figure 8:
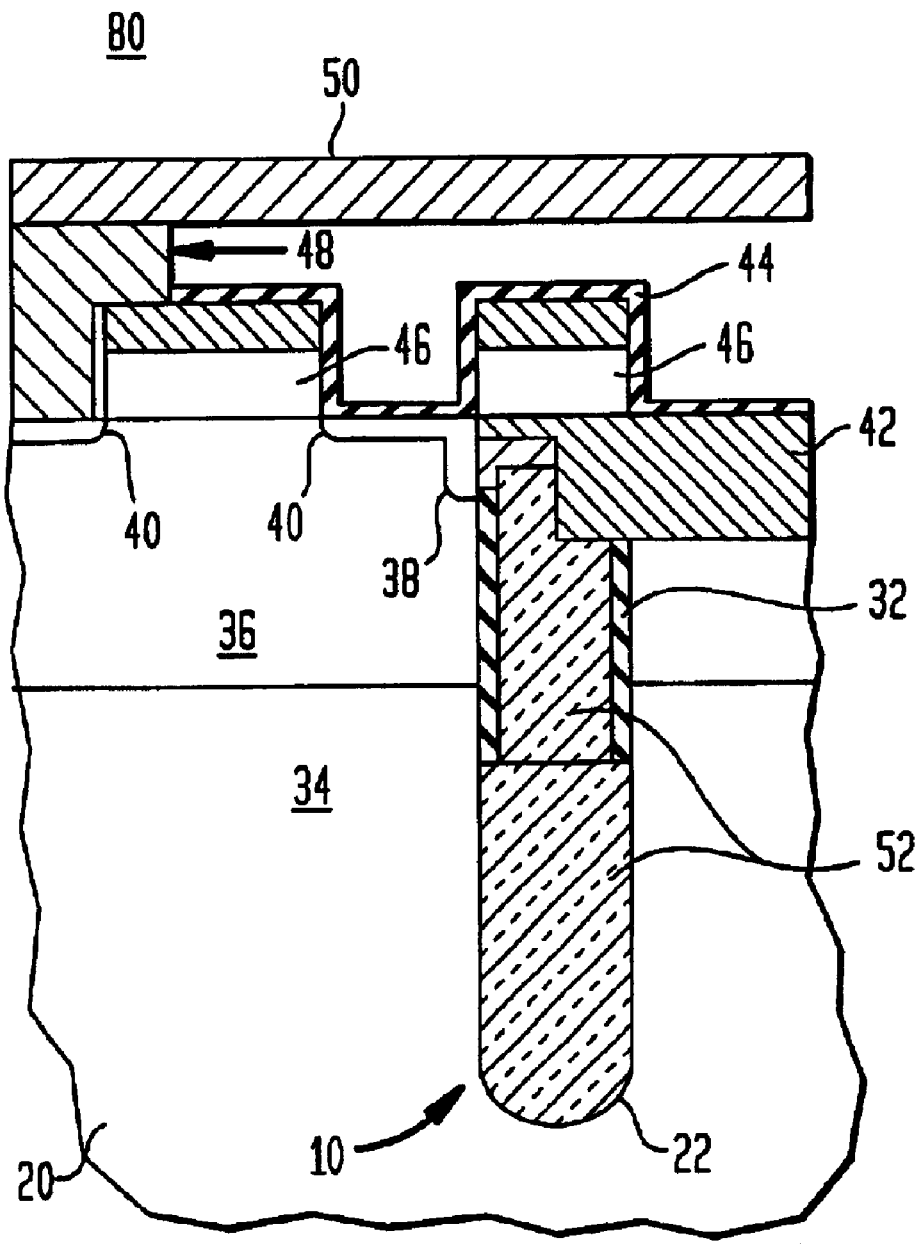
FIG. 8 is a schematic cross-sectional illustration of a DRAM memory cell with a buried strap connecting a transistor to a capacitor.

FIG. 8 illustrates a cross-sectional view of a DRAM memory cell 80 including the trench capacitor 10 having a buried strap contact 38 in the semiconductor substrate 20. The lower portion of the substrate 20 may be buried n-well 34 wherein the substrate 20 may be doped with n-type material. Above n-well 34 may be p-well 36, wherein the substrate 20 may be doped with p-type material. The trench 22 of the trench capacitor 10 may extend vertically through the p-well 36 into the n-well 34. The trench 22 may be substantially filled with a capacitive material of n+ poly-Si 52. Oxide collar 32 can extend through the p-well 36 into the n-well 34, providing some isolation between the trench capacitor 10 and an adjacent transistor having n junctions 40.

Buried strap 38 may act as the connection between the trench capacitor 10 and the transistor. Adjacent to the upper left of the trench 22 is the L-shaped contact of the buried strap 38. The top and upper right of the trench 22 contain a shallow trench isolator (STI) 42, which may used to isolate one DRAM memory cell from another. Poly-Si wordlines 46 are on top of the transistor and the trench capacitor 10 whereby information can be written to and read from the DRAM any memory cell 80. Poly-Si contact 48 is adjacent to one of the two n junctions 40 of the transistor. Isolation 44 overlays a portion of the surface of the DRAM memory cell. Bitline 50 is connected to the poly-Si contact 48. Wordlines 46 may provide electrical contact between, for example, along rows of DRAM memory cells on the semiconductor substrate 20. The bitline 50 may provide electrical contact, for example, along a column of DRAM memory cells on the semiconductor substrate. A particular DRAM memory cell 80 may be chosen by selecting the appropriate wordline 46 and bitline 50.

The buried strap 38 may be fabricated by etching a trench in the p-well 36. It is important that buried strap 38 is properly fabricated. If the trench of the buried strap 38 is too flat, a short circuit can occur between, for example, n junction 40 of the transistor and the trench capacitor 10. If the buried strap 38 is too deep within the substrate 20, the length of the collar 32 may be reduced and a parasitic vertical device may form between the buried strap 38 and the n-well 34. Fabricating the buried strap 38 may take place in multiple steps. First, a solution of NH$_4$OH in water may be applied to the region of substrate 20 comprising poly-Si. Next the poly-Si may be etched until a desired depth is obtained. This process may be repeated until buried strap 38 is formed with an appropriate size and shape. Preferably, the buried strap has a depth of approximately 150 nm. Note that the solution may vary in concentration, temperature and exposure time for each etching iteration.

Figure 9:
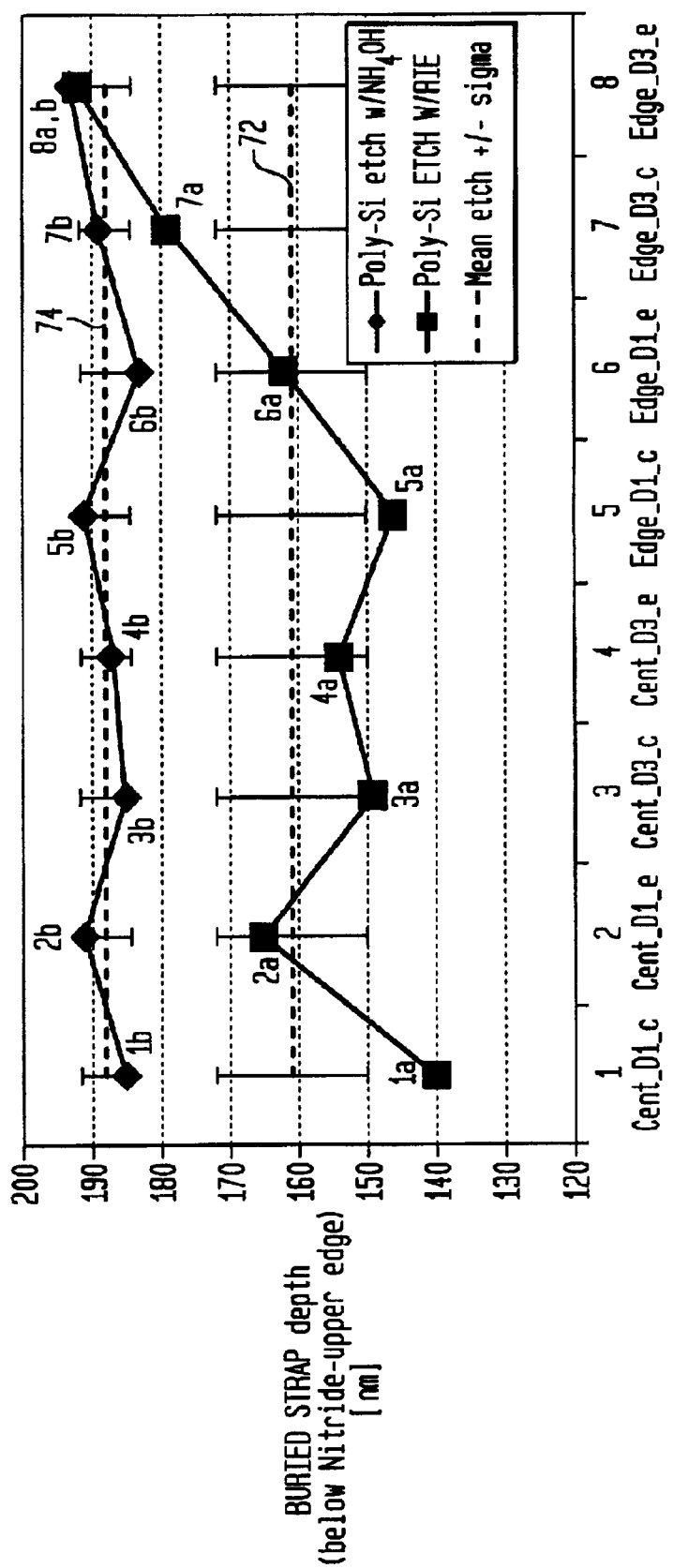
FIG. 9 graphically compares etch depths in poly-Si at various positions on a substrate between RIE and the etching process of the present invention.
Figure 10B:
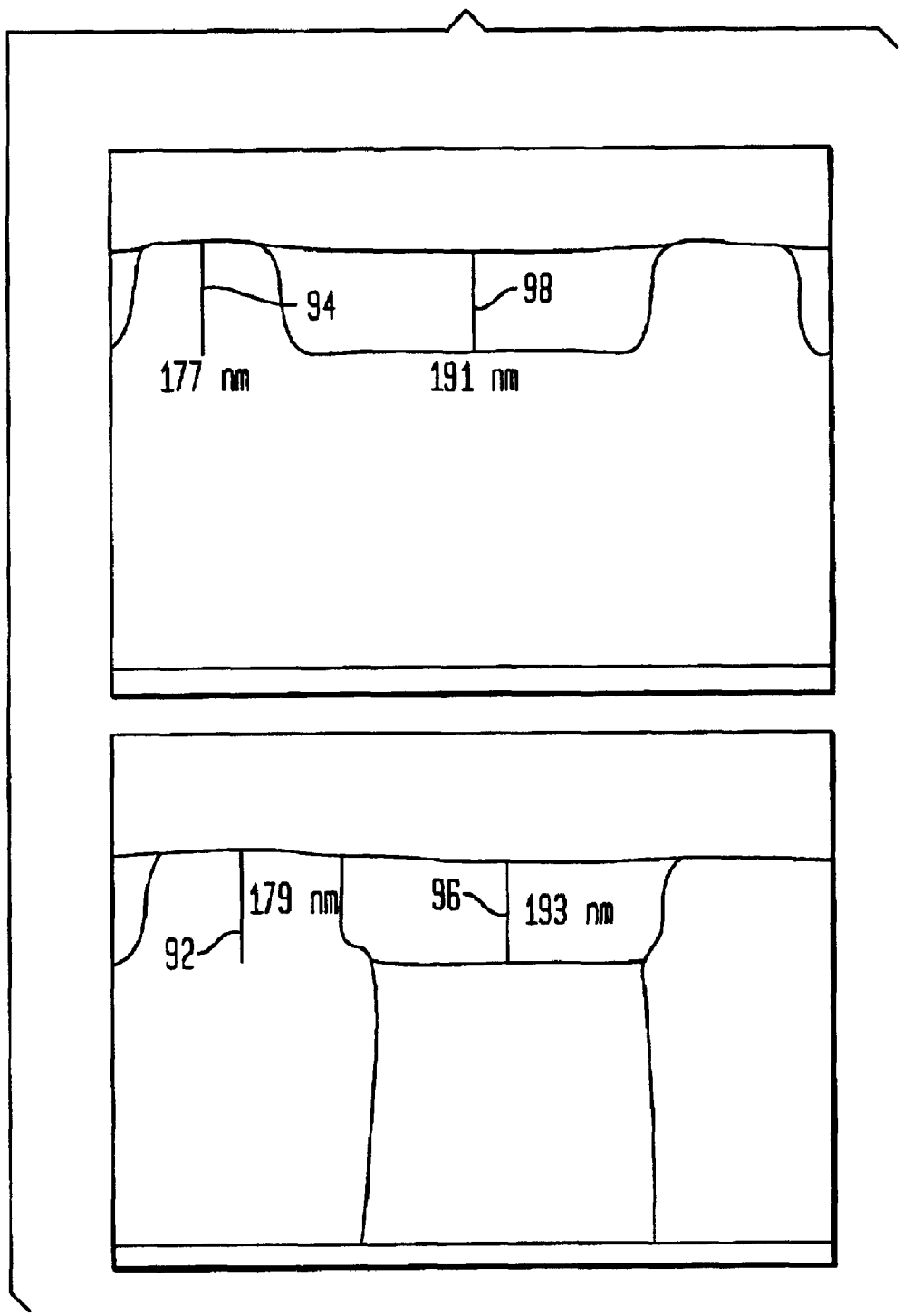
FIG. 10B is a further schematic illustration comparing actual etch depth variances between RIE and the etching process of the present invention.

FIGS. 9, 10A and 10B illustrate how the method of the present invention is superior to RIE when etching poly-Si to form the trench of the buried strap 38 as illustrated in FIG. 8. In particular, FIGS. 9, 10A and 10B illustrate the variations in etch depth when using RIE as compared to a solution of NH$_4$OH in water at various points measured in a semiconductor substrate. In these examples, the solution has a concentration of about 1:60 (NH$_4$OH:H$_2$O), and an etch time of approximately 13 minutes.

FIG. 9 is a graphical illustration representing eight measurements taken at various points in a semiconductor substrate that compare RIE to the solution of NH$_4$OH in water. The horizontal axis represents eight measurements taken at various positions on wafers placed at different locations in the chamber. In particular, points 1–4 were measured on wafers placed in the center of the chamber and points 5–8 were measured on wafers placed at near an edge of the chamber. Specifically, point 1 was measured in the middle of a first wafer in the center of the chamber. Point 2 was measured at the edge of the first wafer. Point 3 was measured in the center of another wafer. Point 4 was measured at the edge of this wafer. Point 5 was measured in the middle of a wafer at the edge of the chamber. Point 6 was measured at the edge of this wafer. Point 7 was measured in the center of a wafer located at the edge of the chamber. Point 8 was measured at the edge of this wafer.

The vertical axis represents the etch depth of the buried strap trench. Square-shaped measurements (1a–8a) correspond to polysilicon etched using RIE. Diamond-shaped measurements (1b–8b) correspond to polysilicon etched using the solution of the present invention.

Point 1a represents an RIE etch depth of about 140 nm below the surface of the substrate at the CENT_D1_c location. Point 1b represents the solution etch depth of about 185 nm below the surface at this location. Point 2a represents an RIE etch depth of about 165 nm below the surface of the substrate at the CENT_D1_e location. Point 2b represents the solution etch depth of about 190 nm below the surface at this location. Point 3a represents an RIE etch depth of about 150 nm below the surface of the substrate at the CENT_D3_c location. Point 3b represents the solution etch depth of about 185 nm below the surface at this location. Point 4a represents an RIE etch depth of about 153 nm below the surface of the substrate at the CENT_D3_e location. Point 4b represents the solution etch depth of about 187 nm below the surface at this location. Point 5a represents an RIE etch depth of about 145 nm below the surface of the substrate at the EDGE_D1_c location. Point 5b represents the solution etch depth of about 190 nm below the surface at this location. Point 6a represents an RIE etch depth of about 162 nm below the surface of the trench at the EDGE_D1_e location. Point 6b represents the solution etch depth of about 185 nm below the surface at this location. Point 7a represents an RIE etch depth of about 180 nm below the surface of the substrate at the EDGE_D3_c location. Point 7b represents the solution etch depth of about 188 nm below the surface at this location. Point 8a represents an RIE etch depth of about 192 nm below the surface of the trench at the EDGE_D3_e location. Point 8b represents the solution etch depth of about 192 nm below the surface at this location. Dashed line 72 represents a mean etch depth (for measurements 1a–8a) of about 161 nm using RIE. Dashed line 74 represents a mean etch depth (for measurements 1b–8b) of about 188 nm using the solution of $NH_4OH$ in water. Thus it is apparent that etching with a solution of the present invention provides less variation in etch depth then etching with RIE.

FIGS. 10A and 10B are a set of illustrations depicting the variances produced for the measurements of FIG. 9 when etching poly-Si with RIE as compared to a solution of $NH_4OH$ in water. In particular, FIG. 10A illustrates two cross section views of etches formed by RIE in a substrate. These RIE etches vary in depth by more than 25 nanometers. Measurement 80 represents a depth of 111 nm below the surface of the substrate at one location, while measurement 82 represents a depth of 92 nm below the surface at an equivalent location in the substrate. Measurement 84 represents a depth of 65 nm below the surface at another location in the substrate, while measurement 86 represents a depth of 39 nm below the surface at an equivalent location in the substrate. And measurement 88 represents a depth of 179 nm below the surface of the substrate at yet another location in the substrate, while measurement 90 represents a depth of 140 nm below the surface at an equivalent location in the substrate.

Similarly, FIG. 10B shows two cross section views of etches formed by a solution of $NH_4OH$ in water according to an embodiment of the present invention. These etches only vary in depth by a few nanometers. Measurement 92 represents a depth of 179 nm below the surface of the substrate at one location in the substrate, while measurement 94 represents a depth of 177 nm below the surface at an equivalent location in the substrate. Measurement 96 represents a depth of 193 nm below the surface at another location in the substrate, while measurement 98 represents a depth of 191 nm below the surface at an equivalent location in the substrate. This tight tolerance of etches created by a solution of the present invention gives a manufacturer very good control over the trench fabrication process.

Making an entry measurement of the nitride upper edge can further control the trench depth. In addition, the temperature of the solution can be held constant by a convolution bath, as in known in the art. It is important to note that the method of the present invention can be applied to other trenches and recesses in addition to those already described. For example, the process could be used for planar recesses when forming collar oxides, for example in the neck of the capacitor trench.

Although the present method has been described with reference to particular embodiments and preferred steps, it is to be understood that these embodiments and steps are merely illustrative of the principles and applications of the present invention. It is therefore to be understood that numerous modifications may be made to the illustrative embodiments and steps and that other arrangements may be devised without departing from the spirit and scope of the present invention as defined by the following claims.

What is claimed is:

1. A method of fabricating a semiconductor device having a polysilicon region with a first dimension, said method comprising:

(a) applying a solution comprising $NH_4OH$ in water to the polysilicon region of a semiconductor substrate, wherein the solution is degasified; and (b) etching the polysilicon with the solution to obtain a second dimension of a desired shape and size.

2. The method of claim 1, wherein the solution has a concentration between 1:2 and 1:200.

3. The method of claim 2, wherein the concentration of $NH_4OH$ to water in the solution is between 1:5 and 1:80.

4. The method of claim 2, wherein the concentration of $NH_4OH$ to water in the solution is between 1:5 and 1:50.

5. The method of claim 1, wherein the temperature of the solution is between 25° C. and 65° C.

6. The method of claim 5, wherein the temperature of the solution is between 25° C. and 45° C.

7. The method of claim 3, wherein the temperature of the solution is between 25° C. and 65° C.

8. The method of claim 5, wherein the temperature of the solution is held substantially constant by a convolution bath.

* * * * *